(12) United States Patent
Miyazaki et al.

(10) Patent No.: US 8,957,708 B2
(45) Date of Patent: Feb. 17, 2015

(54) OUTPUT BUFFER AND SEMICONDUCTOR DEVICE

(71) Applicant: Lapis Semiconductor Co., Ltd., Yokohama (JP)

(72) Inventors: Masahiro Miyazaki, Yokohama (JP); Shuichi Hashidate, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/946,603

(22) Filed: Jul. 19, 2013

(65) Prior Publication Data

US 2014/0028386 A1  Jan. 30, 2014

(30) Foreign Application Priority Data

Jul. 25, 2012  (JP) .................. 2012-164834

(51) Int. Cl.
  *H03B 1/00*  (2006.01)
  *H03K 3/00*  (2006.01)
  *G05F 1/10*  (2006.01)
  *H03K 19/0185*  (2006.01)

(52) U.S. Cl.
  CPC .......... *G05F 1/10* (2013.01); *H03K 19/018521* (2013.01); *H03K 19/018585* (2013.01)
  USPC .......... 327/108; 327/109; 327/110; 327/111; 327/112

(58) Field of Classification Search
  USPC ......................................... 327/108, 109, 112
  See application file for complete search history.

(56) References Cited

U.S. PATENT DOCUMENTS

2011/0032007 A1* 2/2011 Shiah et al. .................... 327/108

FOREIGN PATENT DOCUMENTS

JP  07-066715 A  3/1995

* cited by examiner

*Primary Examiner* — John Poos
(74) *Attorney, Agent, or Firm* — Studebaker & Brackett PC

(57) ABSTRACT

An output buffer has a first transistor and a voltage mitigation second transistor. The first transistor is configured to generate a voltage value corresponding to the power-supply voltage in response to an input signal. The second transistor is provided between an output line and the first transistor. A gate terminal of the second transistor is applied with a power-supply bias voltage which turns the second transistor on and makes a voltage between gate and source terminals of the second transistor constant in accordance with a power-supply voltage.

20 Claims, 3 Drawing Sheets

OUTPUT BUFFER AND SEMICONDUCTOR DEVICE

BACKGROUND OF THE INVENTION

1. Field of the Invention

The present invention relates to an output buffer that includes a complementary metal oxide semiconductor (MOS), and also relates to a semiconductor device having such output buffer.

2. Description of the Related Art

One example of the above-mentioned type of output buffer is an output buffer equipped with voltage mitigation MOS transistors. One voltage mitigation MOS transistor is provided between an output terminal and each p-channel MOS transistor. Also, one voltage mitigation MOS transistor is provided between the output terminal and each n-channel MOS transistor. These voltage mitigation MOS transistors are provided in order to mitigate overshoot and undershoot in an output voltage. The p-channel and n-channel MOS transistors are complementarily turned on/off in response to an input signal. Such output buffer is disclosed in for example Japanese Patent Application Publication (Kokai) 7-66715. In this output buffer, a fixed bias voltage $V_B$ is applied to the gate terminal of each of the voltage mitigation transistors to cause the respective transistor to operate as a resistor element. Such a configuration can prevent sharp change of an output current flowing into the output terminal, and reduce overshoot and undershoot in the output voltage.

Recently, there is a commercialized output buffer that is driven at a power-supply voltage within an acceptable range of 3.0 to 3.6 volts.

In this output buffer, when a power-supply voltage of 3.6 volts is applied, the voltage between the gate and source terminals of a voltage mitigation transistor becomes 3.6 minus $V_B$ ($3.6-V_B$) volts. As a result, an output current proportional to the square of this 3.6 minus $V_B$ volts is generated.

When, on the other hand, a power-supply voltage of 3.0 volts is applied, the voltage between the gate and source terminals of the voltage mitigation transistor becomes 3.0 minus $V_B$ volts. As a result, an output current proportional to the square of this 3.0 minus $V_B$ volts is generated.

According to such configuration, the output current is considerably lower when the power-supply voltage is 3.0 volts than when the power-supply voltage is 3.6 volts. This causes waveform distortion in an output signal when a heavy load is connected to the output buffer.

SUMMARY OF THE INVENTION

An object of the present invention is to provide an output buffer capable of reducing overshoot and undershoot and generating an output signal with no waveform distortion even when an applied power-supply voltage is equal to the lower limit of a voltage acceptable range.

Another object of the present invention is to provide a semiconductor device having such output buffer(s).

According to one aspect of the invention, there is provided an output buffer that is configured to generate an output signal via an output line in response to an input signal. The output signal has a voltage value corresponding to a power-supply voltage. The output buffer includes a first MOS transistor that has a source terminal thereof applied with the power-supply voltage and a gate terminal thereof supplied with the input signal. The output buffer also includes a second MOS transistor that has a drain terminal thereof connected to the output line and a source terminal thereof connected to a drain terminal of the first MOS transistor. The output buffer also includes a bias generation circuit that generates a bias voltage and supplies the bias voltage to a gate terminal of the second MOS transistor. The bias voltage has a voltage value that turns the second MOS transistor on while changing according to the power-supply voltage and makes a voltage between the gate and source terminals of the second MOS transistor constant.

In the output buffer according to the present invention, the gate terminal of the voltage mitigation second MOS transistor (2) is applied with the power-supply bias voltage which turns the second MOS transistor on and makes the voltage between the gate and source terminals of the second MOS transistor constant in accordance with the power-supply voltage. The second MOS transistor is situated between the output line and the first MOS transistor (1) that outputs a voltage value corresponding to the power-supply voltage in response to the input signal. Use of the voltage mitigation transistor can reduce undershoot and overshoot caused in an output signal. In addition, the voltage between the gate and source terminals of the voltage mitigation second MOS transistor becomes constant even when the power-supply voltage is equal to any of the values within the voltage acceptable range.

According to another aspect of the present invention, there is provided a semiconductor device that has an output buffer configured to generate an output signal via an output line in response to an input signal. The output signal has a voltage value corresponding to a power-supply voltage. The output buffer includes a first MOS transistor that has a source terminal thereof applied with the power-supply voltage and a gate terminal thereof supplied with the input signal. The output buffer also includes a second MOS transistor that has a drain terminal thereof connected to the output line and a source terminal thereof connected to a drain terminal of the first MOS transistor. The output buffer also includes a bias generation circuit that generates a bias voltage and supplies the bias voltage to a gate terminal of the second MOS transistor. The bias voltage has a voltage value that turns the second MOS transistor on while changing its value according to the power-supply voltage and makes a voltage between the gate and source terminals of the second MOS transistor constant.

In the output buffer according to the present invention, the gate terminal of the voltage mitigation second MOS transistor (2) is applied with the power-supply bias voltage which turns the second MOS transistor on and makes the voltage between the gate and source terminals of the second MOS transistor constant in accordance with the power-supply voltage. The second MOS transistor is provided between the output line and the first MOS transistor (1) that outputs a voltage value corresponding to the power-supply voltage in response to the input signal. Use of the voltage mitigation transistor can reduce undershoot and overshoot caused in an output signal. In addition, the voltage between the gate and source terminals of the voltage mitigation second MOS transistor is kept constant even when the power-supply voltage is equal to any of the values within the voltage acceptable range.

The output buffer according to the present invention, therefore, can send a constant output current regardless of the value of the power-supply voltage, and therefore can send a high-quality output signal with no waveform distortion even when the applied power-supply voltage is equal to the lower limit of the voltage acceptable range.

These and other objects, aspects and advantages of the present invention will become apparent to those skilled in the art from the following detailed description when read and understood in conjunction with the accompanying drawings and claims.

DETAILED DESCRIPTION OF THE INVENTION

Figure 1:
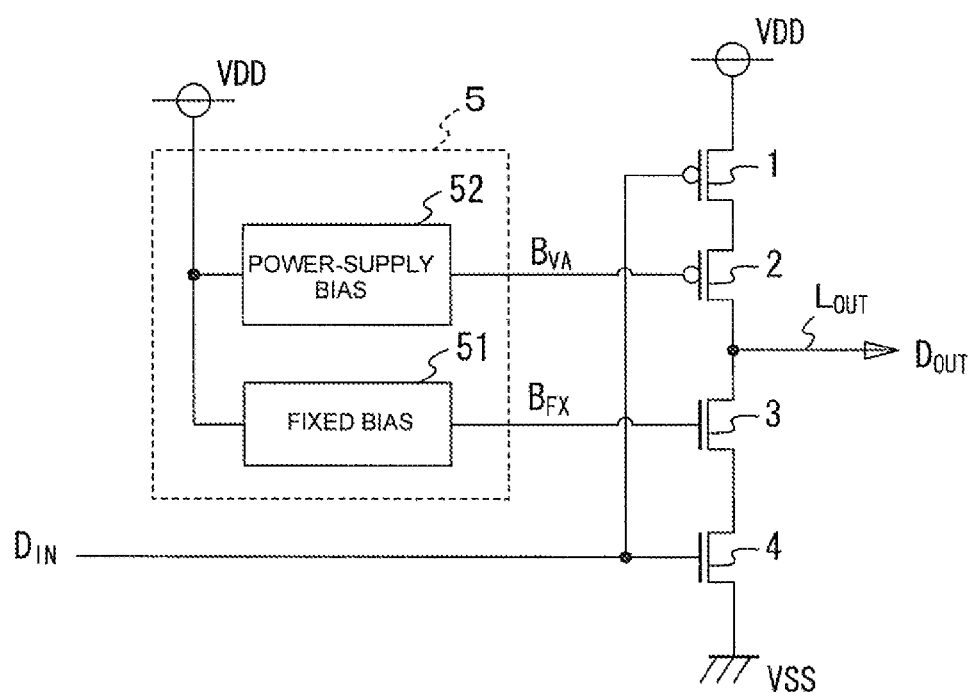
FIG. 1 is a circuit diagram showing an output buffer according to an exemplary embodiment of the present invention.

Referring to FIG. 1, an output buffer 100 according to a preferred embodiment of the present invention will be described.

The output buffer 100 is formed on a semiconductor substrate, which is part of a CMOS semiconductor device, and is designed to operate at a power-supply voltage VDD which is within a voltage acceptable range. The voltage acceptable range is between 3.0 and 3.6 volts in this embodiment. The output buffer 100 includes p-channel MOS transistors 1 and 2, n-channel MOS transistors 3 and 4, and a bias voltage generation circuit 5. The transistors 1 and 4 are inverters constituting the core elements of the output buffer 100, and the transistors 2 and 3 are provided for the purpose of mitigating voltage changes.

An input signal $D_{IN}$ is supplied to a gate terminal of the transistor 1 on the high-potential side and a gate terminal of the transistor 4 on the low-potential side. A power-supply voltage VDD of, for example, 3.0 to 3.6 volts is applied to a source terminal of the transistor 1, and a source terminal of the transistor 2 is connected to a drain terminal of the transistor 1. A power-supply bias voltage $B_{VA}$ (will be described) is supplied from the bias voltage generation circuit 5 to a gate terminal of the transistor 2, and a drain terminal of the transistor 2 is connected to an output line $L_{OUT}$.

A ground voltage VSS of, for example, 0 volts is applied to a source terminal of the transistor 4 on the low-potential side, and a source terminal of the transistor 3 is connected to a drain terminal of the transistor 4. A fixed bias voltage $B_{FX}$ of, for example, 3.0 volts is supplied from the bias voltage generation circuit 5 to a gate terminal of the transistor 3, and a drain terminal of the transistor 3 is connected to the output line $L_{OUT}$.

The bias voltage generation circuit 5 has a fixed bias generation circuit 51 and a power-supply bias generation circuit 52.

The fixed bias generation circuit 51 generates a fixed bias voltage $B_{FX}$ of, for example, 3.0 volts based on the power-supply voltage VDD, and supplies this fixed bias voltage $B_{FX}$ to the gate terminal of the transistor 3. The transistor 3 is provided for the purpose of mitigating voltage changes.

The power-supply bias generation circuit 52 generates the power-supply bias voltage $B_{VA}$ based on the power-supply voltage VDD (will be described), and supplies this power-supply bias voltage $_{BVA}$ to the gate terminal of the transistor 2. The transistor 2 is provided for the purpose of mitigating voltage changes.

Figure 2:
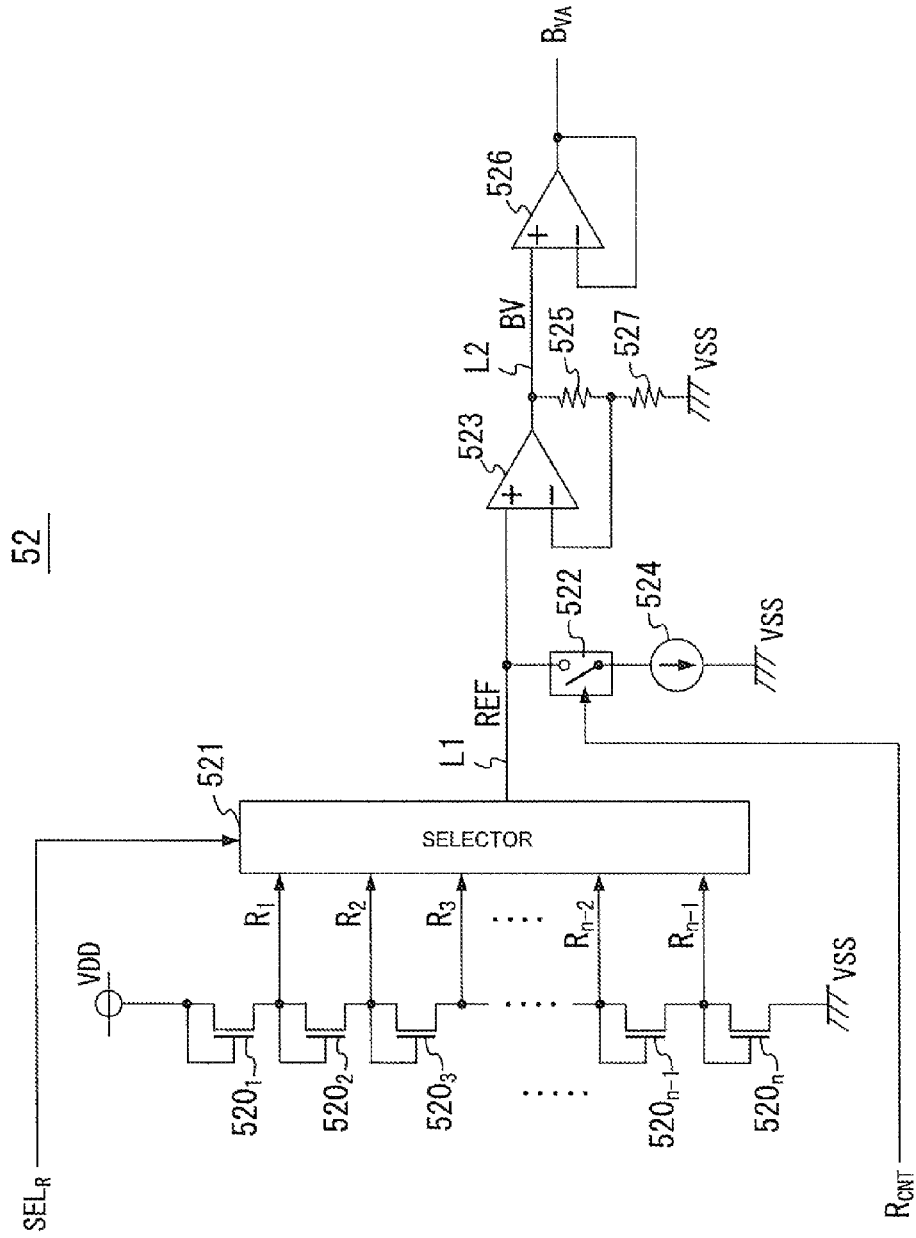
FIG. 2 is a circuit diagram showing an internal configuration of a power-supply bias generation circuit.

FIG. 2 is a circuit diagram showing an example of an internal configuration of the power-supply bias generation circuit 52.

As shown in FIG. 2, n-channel MOS transistors $520_1$ to $520_n$ are diode-connected respectively and are coupled in series to one other. The power-supply voltage VDD is applied to a drain terminal of the transistor $520_1$ at one end of the serial connection, and the ground voltage VSS is applied to a source terminal of the transistor $520_n$ at the other end. Voltages generated at the connecting points between each two transistors $520_1$ to $520_n$ (n is an integer of 2 or more) are supplied to a selector 521 as candidate voltages $R_1$ to $R_{n-1}$ which are candidates for a reference voltage. In other words, the transistors $520_1$ to $520_n$ operate as voltage dividers configured by n resistors connected in series, and supply the selector 521 with the candidate voltages $R_1$ to $R_{n-1}$ of voltage values different from each other. The candidate voltages $R_1$ to $R_{n-1}$ are obtained as a result of dividing the power-supply voltage VDD.

The selector 521 selects, as a reference voltage REF, one of the candidate voltages $R_1$ to $R_{n-1}$ that is indicated (or specified) by an externally supplied reference voltage selection signal $SEL_R$, and supplies the selected voltage to one end of a switching element 522 and a non-inverting input terminal of an operational amplifier 523 via a line L1.

A constant current source 524 is connected to the other end of the switching element 522. The switching element 522 enters an ON state in response to an externally supplied reference voltage fine adjustment signal $R_{CNT}$, and extracts a constant current generated by the constant current source 524 from the line L1. As a result, the voltage on the line L1 drops. In other words, the switching element 522 and the constant current source 524 operate as reference voltage adjustment means for reducing the voltage value of the reference voltage REF by a certain value in response to the reference voltage fine adjustment signal $R_{CNT}$.

An output terminal of the operational amplifier 523 is connected to one end of a resistor 525 and a non-inverting input terminal of an operational amplifier 526 of the next stage via a line L2. The other end of the resistor 525 is connected to one end of a resistor 527 and an inverting input terminal of the operational amplifier 523. The ground voltage VSS is applied to the other end of the resistor 527. According to this configuration, the operational amplifier 523 operates as a non-inverting amplifier circuit and generates (supplies) to the line L2 a bias voltage BV that is obtained as a result of amplifying the voltage value of the reference voltage REF by a gain (1+resistance value of the resistor 525/resistance value of the resistor 527).

The operational amplifier 526 operates as a so-called voltage follower circuit that has an output terminal thereof connected to its own inverting input terminal. A voltage indicated by the bias voltage BV is generated at low impedance as the power-supply bias voltage $B_{VA}$.

Figure 3:
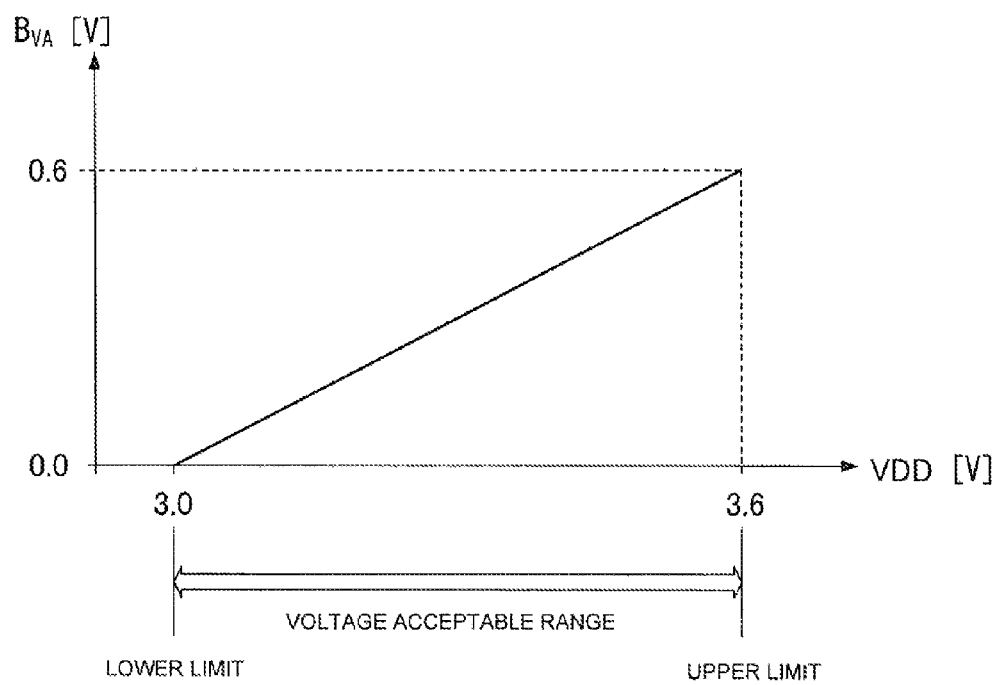
FIG. 3 is a characteristic diagram showing the change in a power-supply bias voltage generated by the power-supply bias generation circuit of FIG. 2 with respect to a power-supply voltage.

According to the configuration shown in FIG. 2, the power-supply bias generation circuit 52 generates the power-supply bias voltage $B_{VA}$ having a voltage value of 0 to 0.6 volts as shown in FIG. 3, in accordance with the power-supply voltage VDD which is within a voltage acceptable range of 3.0 to 3.6 volts. Specifically, as shown in FIG. 3, the power-supply bias generation circuit 52 generates the power-supply bias voltage $B_{VA}$ having a voltage value of 0.6 volts when the power-supply voltage VDD is 3.6 volts, which is the upper limit of the voltage acceptable range, and generates the power-supply bias voltage $B_{VA}$ having a voltage value of 0 volts when the power-supply voltage VDD is 3.0 volts, which is the lower limit of the voltage acceptable range.

In summary, when the power-supply voltage VDD is equal to the lower limit (3.0 volts) of the voltage acceptable range (3.0 to 3.6 volts), the power-supply bias generation circuit 52 generates the modified power-supply bias voltage, the voltage value of which is lower than that obtained when the power-supply voltage VDD is equal to the upper limit (3.6 volts) of the voltage acceptable range by the voltage difference between the upper and lower limits of the acceptable range, i.e., 3.6 volts–3.0 volts=0.6 volts.

In order to allow the power-supply bias generation circuit 52 to generate the power-supply bias voltage $B_{VA}$ in accordance with the power-supply voltage VDD as shown in FIG. 3, first, the reference voltage selection signal $SEL_R$ is used to select from among the candidate voltages $R_1$ to $R_{n-1}$ that are obtained as a result of dividing the power-supply voltage VDD, one optimum voltage as the reference voltage REF. When the power-supply voltage VDD is equal to 3.0 volts, the power-supply bias generation circuit 52 selects the candidate voltage R at which the reference voltage REF on the line L1 becomes 0 volts as a result of voltage reduction adjustment performed by the voltage reduction adjustment means (522, 524). Moreover, the gain of the operational amplifier 523 is set, or, in other words, the resistance values of the resistor 525 and the resistor 527 are set, in such a manner that the power-supply bias voltage $B_{VA}$ is shifted from 0 volts to 0.6 volts, as shown in FIG. 3, when the power-supply voltage VDD is shifted from 3.0 volts to 3.6 volts.

An operation of the output buffer 100 having the configuration shown in FIG. 1 is now described.

Firstly, supplying the input signal $D_{IN}$ of logical level 1 turns the transistor 1 off and the transistor 4 on. Consequently, a current is drawn from the output line $L_{OUT}$ via the transistors 3 and 4. This causes the voltage on the output line $L_{OUT}$ to drop. As a result, an output signal $D_{OUT}$ of logical level 0, corresponding to the ground voltage VSS, is supplied on the output line $L_{OUT}$. On the other hand, supplying the input signal $D_{IN}$ of logical level 0 turns the transistor 1 on and the transistor 4 off. Consequently, a current based on the power-supply voltage VDD is sent to the output line $L_{OUT}$ via the transistors 1 and 2. This causes the voltage on the output line $L_{OUT}$ to increase. As a result, the output signal $D_{OUT}$ of logical level 1, corresponding to the power-supply voltage VDD, is supplied on the output line $L_{OUT}$.

When the power-supply voltage VDD is 3.6 volts, which is the upper limit of the voltage acceptable range, a power-supply bias voltage $B_{VA}$ of 0.6 volts shown in FIG. 3 is supplied to the gate terminal of the voltage mitigation transistor 2. As a result, the voltage between the gate and source terminals of the transistor 2 becomes 3.6 minus 0.6 volts, i.e., 3.0 volts. Consequently, when the input signal $D_{IN}$ of logical level 0 is supplied, the transistor 1 is turned on, and an output current proportional to the square of the voltage between the gate and source terminals of the transistor 2, which is the square of 3.0 volts, is sent to the line $L_{OUT}$.

On the other hand, when the power-supply voltage VDD is 3.0 volts, which is the lower limit of the voltage acceptable range, a power-supply bias voltage $_{BVA}$ of 0 volts shown in FIG. 3 is supplied to the gate terminal of the transistor 2. As a result, the voltage between the gate and source terminals of the transistor 2 becomes 3.0 volts. Consequently, when the input signal $D_{IN}$ of logical level 0 is supplied, the transistor is turned on, and an output current proportional to the square of the voltage between the gate and source terminals of the voltage mitigation transistor 2, which the square of is 3.0 volts, is sent to the line $L_{OUT}$.

Because the output buffer 100 shown in FIGS. 1 and 2 has the voltage mitigation MOS transistors 2 and 3, undershoot and overshoot in the output signal can be reduced. In addition, because the voltage between the gate and source terminals of each voltage mitigation transistor becomes constant (3.0 volts) even when the power-supply voltage (VDD) is equal to any of the values within the voltage acceptable range (between 3.0 and 3.6 volts), a constant output current can be generated regardless of the value of the power-supply voltage.

Therefore, even when the power-supply voltage to be applied is equal to the lower limit (3.0 volts) of the voltage acceptable range, a high-quality output signal ($D_{OUT}$) with no waveform distortion is generated.

In the embodiment shown in FIG. 1, the fixed bias voltage ($B_{FX}$) is applied to the gate terminal of the voltage mitigation n-channel MOS transistor 3 regardless of the value of the power-supply voltage VDD (3.0 to 3.6 volts), but the present invention is not limited in this regard. For example, a bias voltage that changes between a threshold voltage Vth of the transistor 3 and 3.0 volts on the basis of the power-supply voltage VDD may be applied to the gate terminal of the transistor 3 instead of the fixed bias voltage.

This application is based on Japanese Patent Application No. 2012-164834 filed on Jul. 25, 2012, and the entire disclosure thereof is incorporated herein by reference.

What is claimed is:

1. An output buffer that is configured to output an output signal via an output line in response to an input signal, the output signal having a voltage value corresponding to a power-supply voltage, the output buffer comprising:
    a first MOS transistor that has a source terminal thereof applied with the power-supply voltage and a gate terminal thereof supplied with the input signal;
    a second MOS transistor that has a drain terminal thereof connected to the output line and a source terminal thereof connected to a drain terminal of the first MOS transistor; and
    a bias generation circuit that is configured to generate a bias voltage and to supply the bias voltage to a gate terminal of the second MOS transistor so as to turn on the second MOS transistor,
    wherein the bias generation circuit changes the voltage value of the bias voltage in accordance with a voltage value of the power-supply voltage to make a voltage between the gate and source terminals of the second MOS transistor constant.

2. The output buffer according to claim 1, wherein when the power-supply voltage is equal to a lower limit of a voltage acceptable range, the bias generation circuit generates the bias voltage, the voltage value of which is lower than the voltage value obtained when the power-supply voltage is equal to an upper limit of the voltage acceptable range by a voltage difference between the upper and lower limits of the voltage acceptable range.

3. The output buffer according to claim 1, wherein the bias generation circuit includes:
    a divider configured to divide the power-supply voltage so as to prepare a plurality of candidate voltages different from each other;
    a selector configured to select one of the plurality of candidate voltages that is indicated by a selection signal and take the selected voltage as a reference voltage;
    a reference voltage adjustment circuit configured to adjust a value of the reference voltage by a predetermined value; and
    an amplifier configured to generate, as the bias voltage, a voltage obtained by amplifying the reference voltage adjusted by the reference voltage adjustment circuit.

4. The output buffer according to claim 1, further comprising:
    a third MOS transistor having a drain terminal thereof connected to the output line;
    a fourth MOS transistor having a source terminal thereof applied with a ground voltage, a drain terminal thereof connected to a source terminal of the third MOS transistor, and a gate terminal thereof supplied with the input signal; and a fixed bias generation circuit that is configured to generate a second bias voltage based on the power-supply voltage and supply the second bias voltage to a gate terminal of the third MOS transistor, the second bias voltage having a fixed voltage value for turning the third MOS transistor on.

5. The output buffer according to claim 3, wherein the reference voltage adjustment circuit lowers the value of the reference voltage by the predetermined value.

6. The output buffer according to claim 3, wherein the divider includes a series of n-channel transistors.

7. The output buffer according to claim 6, wherein the number of the n-channel transistors is greater than the number of the candidate voltages by one.

8. The output buffer according to claim 1, wherein the first MOS transistor is an inverter and the second MOS transistor is a voltage mitigation element.

9. The output buffer according to claim 4, wherein the third MOS transistor is a voltage mitigation transistor and the fourth MOS transistor is an inverter.

10. The output buffer according to claim 2, wherein the voltage acceptable voltage is between 3.0 volts and 3.6 volts.

11. A semiconductor device comprising:
an output buffer that outputs an output signal via an output line in response to an input signal, the output signal having a voltage value corresponding to a power-supply voltage, the output buffer including:
a first MOS transistor that has a source terminal thereof applied with the power-supply voltage and a gate terminal thereof supplied with the input signal;
a second MOS transistor that has a drain terminal thereof connected to the output line and a source terminal thereof connected to a drain terminal of the first MOS transistor; and
a bias generation circuit that is configured to generate a bias voltage and to supply the bias voltage to a gate terminal of the second MOS transistor-as to turn on the second MOS transistor,
wherein the bias generation circuit changes the voltage value of the bias voltage in accordance with a voltage value of the power-supply voltage to make a voltage between the gate and source terminals of the second MOS transistor constant.

12. The semiconductor device according to claim 11, wherein when the power-supply voltage is equal to a lower limit of a voltage acceptable range, the bias generation circuit generates the bias voltage, the voltage value of which is lower than the voltage value obtained when the power-supply voltage is equal to an upper limit of the voltage acceptable range by a voltage difference between the upper and lower limits of the voltage acceptable range.

13. The semiconductor device according to claim 11, wherein the bias generation circuit includes:
a divider that is configured to divide the power-supply voltage so as to prepare a plurality of candidate voltages different from each other;
a selector that is configured to select one of the plurality of candidate voltages that is indicated by a selection signal and take the selected voltage as a reference voltage;
a reference voltage adjustment circuit that is configured to adjust a value of the reference voltage by a predetermined value; and
an amplifier that is configured to generate, as the bias voltage, a voltage obtained by amplifying the reference voltage adjusted by the reference voltage adjustment circuit.

14. The semiconductor device according to claim 11, wherein the output buffer further comprises:
a third MOS transistor having a drain terminal thereof connected to the output line;
a fourth MOS transistor having a source terminal thereof applied with a ground voltage, a drain terminal thereof connected to a source terminal of the third MOS transistor, and a gate terminal thereof supplied with the input signal; and
a fixed bias generation circuit that is configured to generate a second bias voltage based on the power-supply voltage and supply the second bias voltage to a gate terminal of the third MOS transistor, the second bias voltage having a fixed voltage value for turning the third MOS transistor on.

15. The semiconductor device according to claim 13, wherein the reference voltage adjustment circuit lowers the value of the reference voltage by the predetermined value.

16. The semiconductor device according to claim 13, wherein the divider includes a series of n-channel transistors.

17. The semiconductor device according to claim 16, wherein the number of the n-channel transistors is greater than the number of the candidate voltages by one.

18. The semiconductor device according to claim 11, wherein the first MOS transistor is an inverter and the second MOS transistor is a voltage mitigation element.

19. The semiconductor device according to claim 14, wherein the third MOS transistor is a voltage mitigation transistor and the fourth MOS transistor is an inverter.

20. The semiconductor device according to claim 12, wherein the voltage acceptable voltage is between 3.0 volts and 3.6 volts.

* * * * *